United States Patent [19]

Cordani

[11] Patent Number: 5,221,418
[45] Date of Patent: Jun. 22, 1993

[54] METHOD FOR IMPROVING THE SURFACE INSULATION RESISTANCE OF PRINTED CIRCUITS

[75] Inventor: John L. Cordani, Waterbury, Conn.

[73] Assignee: MacDermid, Incorporated, Waterbury, Conn.

[21] Appl. No.: 833,928

[22] Filed: Feb. 11, 1992

[51] Int. Cl.$^5$ .................... B44C 1/22; C23F 1/00; B29C 37/00

[52] U.S. Cl. .................... 156/630; 156/634; 156/656; 156/659.1; 156/666; 156/668; 156/902

[58] Field of Search .......... 156/629, 630, 634, 656, 156/659.1, 666, 902, 668; 252/79.2, 79.5; 134/2, 3; 427/96, 97, 98; 29/846, 852

[56] References Cited

U.S. PATENT DOCUMENTS

| | | | |
|---|---|---|---|
| 4,430,154 | 2/1984 | Stahl et al. | 156/651 |
| 4,515,829 | 5/1985 | Deckert et al. | 427/97 |
| 4,592,852 | 6/1986 | Courduvelis et al. | 252/79.1 |
| 4,597,988 | 7/1986 | Kukanskis et al. | 427/97 |
| 4,601,783 | 7/1986 | Krulik | 156/655 |
| 4,601,784 | 7/1986 | Krulik | 156/655 |
| 4,629,636 | 12/1986 | Courduvelis et al. | 427/444 |
| 4,756,930 | 7/1988 | Kukanskis et al. | 427/97 |
| 4,978,422 | 12/1990 | Letize et al. | 156/656 |
| 5,032,427 | 7/1991 | Kukanskis et al. | 427/97 |

FOREIGN PATENT DOCUMENTS

WO8505755 12/1985 PCT Int'l Appl.

*Primary Examiner*—William A. Powell
*Attorney, Agent, or Firm*—St. Onge Steward Johnston & Reens

[57] ABSTRACT

After the etching away of copper to selectively expose surface areas of insulating resin material in a printed circuit process based upon metal-clad insulating substrate material, the exposed surface areas of insulating material are contacted with a liquid treatment composition effective to soften or swell the resin material such that residual metal species otherwise associated with the surface area are removed or, at the least, become entrapped or encapsulated below a surface of resin, such that the surface insulation resistance afforded by the insulating surface areas of the printed circuit is improved.

9 Claims, No Drawings

METHOD FOR IMPROVING THE SURFACE INSULATION RESISTANCE OF PRINTED CIRCUITS

BACKGROUND OF THE INVENTION

The present invention relates to the manufacture of printed circuits and, more particularly, to a process for improving the surface insulation resistance of printed circuit boards.

In the manufacture of printed circuits, a fundamental starting material is an insulating substrate material, typically composed of an epoxy or polyimide resin and typically glass-reinforced, having a thin layer of metal (e.g., copper foil) adherently bonded to one or both of its top and bottom substantially planar surfaces. From this metal-clad printed circuit board starting material, a variety of different types of processes can be carried out to selectively define on the surfaces those areas which will constitute conductive circuitry of the printed circuit and those areas which will be non-conductive. The hallmark of all such processes is an eventual etching of metal, including the original thin layer of metal, in selected areas to there expose the underlying insulating substrate.

In a typical process, for example, innerlayer circuits for multilayer printed circuits are fabricated from a copper foil-clad insulating substrate by arranging an etch-resistant material on the copper surfaces (e.g., of the foil per se or of a further copper layer built up thereon) in the positive pattern of the desired circuitry. The copper not covered by the etch-resist is then etched away down to the substrate surface, and the resist then removed, to thus provide a surface pattern of circuitry lines separated by insulating substrate areas.

In another typical process, such as for fabricating double-sided printed circuits or for providing circuitry patterns on the outer-facing surfaces of a multi-layer printed circuit, a copper foil-clad insulating substrate constitutes the starting material of the double-sided circuit or of the outer-facing layers, as the case may be. Through-holes for conductive interconnection of circuitry layers otherwise separated by insulating substrate material (including innerlayer circuits in multi-layer circuits) are drilled through the board or multi-layer composite, and the surfaces are then metallized (such as by electroless copper) to provide copper metal on the through-hole surfaces and to provide additional copper over the copper foil. An organic plating resist (e.g., from the application, imaging and development of a photoresist) is then applied to board surfaces to provide a plating resist pattern in the negative of the desired circuitry pattern, and additional copper is selectively built up on the non-resist areas via electroplating. Thereafter, an etch-resistant material (e.g., tin-lead or another organic resist) is selectively deposited onto the exposed copper areas not covered by the plating resist, and thereafter the plating resist is removed. The board is then treated with a copper etchant to etch away the copper areas which were previously covered by the plating resist, thereby arriving at a selective pattern of conductive circuitry and insulating substrate areas on the board surfaces. Typical processing steps thereafter may include stripping of the tin-lead or organic etch-resist followed by selective application of a solder mask. If tin-lead was employed as the etch-resist, another option is reflow and fusing of the tin-lead before application of solder mask.

Critical to the functionality of printed circuits is the electrical integrity of the selective conductive paths and areas, as provided by the selective areas of insulating material which separates them on the board surface. To this end, the insulating material used in producing the copper foil clad substrates as the starting material in printed circuit manufacture is chosen to have a high electrical resistance. The surface of insulating material exposed after selective etching during the printed circuit manufacturing process generally exhibits somewhat less resistivity than the original insulating material itself, sometimes as a consequence of incomplete etching away of copper, but more commonly as a consequence of the presence on the surface of metal species from compounds (e.g., zinc and/or chrome compounds) employed by board manufacturers in the process of adhering the copper foil to the insulating substrate, which metal species are apparently so intimately associated with the board surface as to resist complete removal in the copper etching process. The decreased resistivity of the insulating material surface brought about by the presence of these metal species can be tolerated in certain printed circuits where relatively large insulating areas separate conductive areas. However, the trend today is toward much more complex and dense circuitry patterns, and as a consequence poor resistivity of the insulating surface areas, and particularly latent conductive paths thereon resulting from retained metal species, can readily lead to undesired cross-talk and shorting between closely-spaced conductive areas.

Commonly-assigned Letize U.S. Pat. No. 4,978,422 addresses the foregoing problems and describes a process whereby the insulating areas of a printed circuit board which are exposed after a selective copper etching are thereafter contacted with an aqueous alkaline permanganate solution at conditions effective to remove from the insulating areas a sufficient quantity of metal species so as to improve the electrical resistance afforded by the insulating areas in the printed circuit, followed then by neutralization of any residual manganese species. According to the Letize '422 Patent, the contact with alkaline permanganate effects the removal of a thin surface layer of the insulating substrate material, and with it the metal species embedded in or otherwise associated with the surface layer.

Although effective for its stated purpose, the permanganate process of Letize is not without some disadvantages in commercial practice. One difficulty is economic, in that the necessity for two processing steps (treatment with alkaline permanganate, and neutralization of residual manganese species) adds material expense and extends processing time. Another potential difficulty is the risk posed by too substantial or aggressive an attack of the insulating substrate, and removal of more than desired portions thereof, by the alkaline permanganate solution if not carefully controlled.

SUMMARY OF THE INVENTION

It is a primary object of the present invention to provide a process for fabricating printed circuits from metal foil-clad insulating substrate materials, in which the electrical resistance of the insulating substrate material is maintained at a sufficiently high level so as to avoid problematical cross-talk and/or shorting between or among conductive areas of the printed circuit.

Another more specific object of the invention is to provide a process for treating insulating substrate surfaces which are exposed in the etching of copper from a copper-clad insulating substrate material to increase the resistance of the exposed insulating substrate surfaces.

These and other objects are provided by an improvement in those process for fabricating a printed circuit in which a printed circuit board, composed of an insulating substrate resin material having a thin metal layer adhered to at least one surface thereof, is selectively etched to remove portions of the metal layer and thereby expose the underlying insulating substrate resin material, thus providing a printed circuit having a predetermined surface pattern of conductive areas and insulating areas composed of the insulating substrate resin material. The improvement in such processes comprises contacting the exposed insulating areas, after the selective etching, with a liquid treatment composition which is effective to soften or swell the resin material of the exposed insulating areas. The contacting is carried out for a time and at conditions which are effective to soften or swell at least a surface portion of the resin material of these exposed insulating areas. As a result of this softening or swelling, there is a relative movement between resin and metal species originally affixed to or associated with the insulating area surfaces such that the metal species are either removed altogether or, at the very least and more typically, end up below the surface per se and are there entrapped or encapsulated by the resin material. Thus, after the contacting, the resin material substantially returns to its unsoftened or unswelled condition, and the surface thereof has a substantially reduced quantity of metal species associated therewith than existed prior to the treatment, and with the consequent result that the surface of the insulating areas has a higher electrical resistance than existed before the treatment.

By virtue of the improved process of the invention, the improvement in surface insulating resistance is achieved in a single treatment step and utilizing treatment materials which do not effect any measurable removal of insulating resin.

DETAILED DESCRIPTION OF THE INVENTION

The process of the present invention is generally applicable to any metal-clad insulating substrate board material where the metal (e.g., copper foil) cladding has been adhered to the surface or surfaces of the substrate by means which involve metallic compounds such that, after etching to expose an insulating substrate surface, residual metal species result in a decrease of the resistance of the substrate surface and the potential for providing conductive paths which could lead to cross-talk and/or shorting between conductive areas separated from each other by the insulating surface. The insulating substrate material generally will be chosen so as to have an inherent resistance of at least about $10^8$ ohms, and a purpose of the invention is to arrange that, after steps for fabricating a printed circuit, the surface areas of this insulating substrate material which separate desired conductive surface areas will have a similarly high resistance value. The insulating substrate material can be any suitable dielectric which is softenable or swellable by contact with liquid treatment compositions, including thermosetting and thermoplastic polymers and resins, and most particularly will be epoxy-based or polyimide-based, typically with glass or other reinforcing fibers interspersed therein.

The process of the invention is generally applicable to any printed circuit fabrication technique wherein the metal cladding on the insulating substrate is eventually selectively etched away to provide insulating areas on the printed circuit. In some cases, the original metal cladding is the only metal selectively etched away in the process, while in most processes, the cladding will have had built up thereon additional metal thickness by electroless and/or electrolytic processes, all as well known in the art, such that the selective etching down to the insulating substrate surface requires etching away of more than just the metal cladding at those areas.

Generally speaking, the contact of the exposed surface areas of insulating substrate material with liquid treatment composition can be carried out at any time after the etching process has been completed. In fabricating innerlayers, for example, the contacting of the exposed surface areas of insulating substrate resin material can be carried out after the etching process and either before or after removal of organic resist material. Indeed, in certain cases, the contacting might also constitute all or a portion of the resist removal step. In the fabrication of double-sided circuits or in the provision of circuitry on outer layers of multilayer circuits, here again the contacting, after etching, can be carried out before or after stripping of the etch resist, and if the etch resist is an organic resist, possibility also exists here for the contacting step to constitute all or a portion of the resist stripping step. If a metallic etch resist is employed, such as tin-lead, and if the metal is to be reflowed and fused rather than stripped, it is preferred to carry out the contacting of the exposed surface areas of insulating resin material after this reflow and fusing. In any process where selected areas of the surface are to be solder masked (e.g., all areas other than through-holes, surrounding pads and any surface mount areas), then obviously the contacting step will be carried out before solder masking.

As will be apparent, there are a wide variety of printed circuit fabrication processes to which the present invention is applicable, and as a consequence there is an equally wide variety of possible and logical points in those processes where the process of the invention can, or will best, be carried out.

The key characteristic of the liquid treatment composition utilized in the process of the invention is that it be capable of softening or swelling the particular resin material which is utilized as the insulating substrate material in the printed circuit. As such, the choice of a particular liquid treatment composition will be dictated by the particular resin material in question. It also is preferred that the particular liquid treatment composition chosen be one that can effect the requisite softening or swelling under relatively mild conditions and in the shortest possible time. As is apparent, the process is carried out on a surface on which there also is present a conductive circuitry pattern, so compositions which might have any tendency to adversely affect the circuitry, either by reason of components of the composition or by reason of the conditions at which the composition must be employed to achieve the softening or swelling, must be avoided. As is also apparent, the liquid treatment composition has at least the potential for also softening or swelling the resin surface over which the circuitry lies, but in general it is found that with any reasonable choice of compositions and contact conditions, very little such softening or swelling occurs and not to any degree that might adversely affect the circuitry pattern.

The choice of liquid treatment compositions is very wide ranging within these parameters, given that there are numerous materials which will soften or swell the resins (e.g., epoxy-based, polyimide-based) typically encountered in printed circuits. Indeed, many such useful compositions already are known for use in printed circuit fabrication processes, such as in pretreatment of through-hole surfaces to soften or swell the resin material thereof preparatory to a treatment with an oxidizing agent (e.g., chromic acid, permanganate solutions, and the like) to effect desmearing, or etchback or topography alteration. See, for example, U.S. Pat. Nos. 4,515,829; 4,592,852; 4,597,988; 4,601,783; 4,601,784; 4,629,636; 4,756,930; and 5,032,427; and published PCT application No. WO85/05755, all incorporated herein by reference, for useful agents (sometimes referred to in these patents as "solvents") for effecting the softening or swelling of resins such as epoxies and polyimides. Among the most suitable liquid treatment compositions for epoxy-based insulating substrate resin materials are those containing ketones, ethers, ether alcohols, N-methylpyrrolidone, m-pyrol, and the like, either alone or in combination, and typically utilized in aqueous solution, and more typically in an alkaline solution. Also useful for epoxy-based resins and for some polyimide-based resins are the water-immiscible phenyl ethers such as the ethylene or propylene glycol phenyl ethers. Highly suitable for polyimide-based resins is an aqueous solution containing alkali compounds, such as sodium or potassium hydroxide. Especially suitable for use with either epoxy-based or polyimide-based resins are the multi-functional homogeneous compositions of water, alkali metal compounds, water-immiscible organic liquid and surfactant as disclosed in Kukanskis et al U.S. Pat. No. 5,032,427.

Most of the foregoing liquid treatment compositions will be utilized at a temperature above room temperature, and typically in the range of from about 100° F. to about 190° F. Depending upon concentrations, temperatures, and the like, it generally will be found that a sufficient contact time for these compositions will be on the order of anywhere from about one (1) to about five (5) minutes.

The choice of any particular composition and the extent of treatment will essentially be dictated by the result to be achieved. Thus, the exposed surface areas of the insulating substrate resin material will, after the etching process, have affixed thereto or associated therewith a quantity of residual metal species, as earlier discussed. The object of the contacting with the liquid treatment composition is, in essence, to arrange that these metal species, or at the least a substantial proportion thereof, are either removed or, at the least and more typically, end up below a surface of resin rather than on the surface. As such, the treatment with the liquid treatment composition need only act upon the surface of the exposed areas of insulating substrate resin material, and need soften or swell them only to a degree necessary to result in relative movement of resin and metal species such that, at the end of the treatment, a sufficient proportion of the metal species are either removed or end up sufficiently below the resin surface and are there encapsulated or entrapped by resin material, such that the surface per se is, in larger part than before, composed of the resin material. In this way, the insulating resistance of the insulating substrate surface is increased, with consequent minimizing of possibilities for cross-talk or shorting between closely adjacent conductive paths. In most cases, the extent of treatment to bring about this result is quite minimal, and does not involve any excessive softening, swelling or flow of the resin material.

The invention is further described and illustrated in the following examples.

EXAMPLE I

A standard copper foil-clad glass-reinforced epoxy panel was drilled to provide through-holes therein, then electrolessly copper plated, patterned with organic resist in the negative of the desired circuitry, the exposed copper areas then built up to further thickness with electroplated copper, and then over-plated with an electroplated tin-lead etch-resist. The organic resist was then removed, and the electroless copper and copper foil thereunder was etched away down to the substrate surface. The tin-lead electroplated layer was then stripped.

At this point in the process, measurement was made of the insulating resist of the exposed insulating surfaces, and found to be, on average, $1 \times 10^9$ ohms. Thereafter, the panel was immersed in a solution of water, caustic, ethylene glycol ether and surfactants at 150° F. for 5 minutes and water rinsed. The insulation resistance of the exposed insulating areas was found at that point to be, on average, $1 \times 10^{12.9}$ ohms.

EXAMPLE II

A standard copper foil-clad glass-reinforced polyimide panel was identically processed as in Example I. After stripping of tin-lead, the surface insulation resistance of the exposed insulating areas was determined to be $10^9$ ohms on average, and the panel was thereafter immersed in an aqueous solution containing 240 g/l caustic for 5 minutes at 150° F., and rinsed. Following this treatment, the surface insulation resistance was measured as $1 \times 10^{12.2}$ ohms.

EXAMPLE III

Example II was repeated using a standard copper foil-clad FR-4 epoxy panel in place of the copper foil-clad polyimide panel as the starting material. After stripping of tin-lead, the surface insulation resistance of the exposed insulating areas was determined to be $10^9$ ohms on average. Following the treatment with 240 g/l caustic for 5 minutes at 150° F. and rinsing, the surface insulation resistance of the exposed insulating areas was measures as $1 \times 10^{11.7}$ ohms The foregoing is provided to illustrate and describe the invention and particular preferred embodiments thereof, and is not to be taken as limiting the scope of the invention except as recited in the appended claims.

What is claimed is:

1. In a process for fabricating a printed circuit, wherein a printed circuit material, composed of an insulating substrate resin material having a thin metal layer adhered to at least one surface thereof, is selectively etched to remove said metal layer from selected surface areas to there expose said insulating substrate resin material and thus provide a printed circuit material having a surface pattern of conductive areas and insulating areas composed of the insulating substrate resin material, the improvement comprising contacting said exposed insulating areas, after said selective etching, with a liquid treatment composition effective to soften or swell said resin material, said contacting being for a time, and at conditions, effective to soften or swell at least a surface portion of said resin material of said insulating areas to a sufficient degree such that at least a portion of metal species otherwise affixed to or associated with said surface portion undergo relative movement with respect thereto and as a result are eliminated from said surface portion, whereby the surface insulation resistance of said exposed insulating areas is increased relative to the surface prior to said contacting.

2. A process according to claim 1 wherein said thin metal layer comprises copper foil.

3. A process according to claim 2 wherein said insulating substrate resin material comprises an epoxy resin.

4. A process according to claim 3 wherein said liquid treatment composition comprises at least one member selected from the group consisting of a ketone, an ether and an ether alcohol.

5. A process according to claim 2 wherein said insulating substrate resin material comprises polyimide.

6. A process according to claim 5 wherein said liquid treatment composition comprises an alkali metal compound.

7. A process according to claim 1 wherein the elimination of said portion of metal species from said surface portion of resin material comprises removal of metal species from said surface portion of resin material.

8. A process according to claim 1 wherein the elimination of said portion of metal species from said surface portion of resin material comprises causing metal species to reside below said surface portion.

9. A process according to claim 1 wherein the elimination of said portion of metal species from said surface portion of resin material comprises a combination of removal of metal species from said surface portion and causing metal species to reside below said surface portion.

* * * * *